United States Patent [19]

Struger et al.

[11] 4,275,307
[45] Jun. 23, 1981

[54] INPUT CIRCUIT FOR DIGITAL CONTROL SYSTEMS

[75] Inventors: Odo J. Struger, Chagrin Falls; Joseph R. Branc, Wickliffe, both of Ohio

[73] Assignee: Allen-Bradley Company, Milwaukee, Wis.

[21] Appl. No.: 38,506

[22] Filed: May 14, 1979

Related U.S. Application Data

[63] Continuation-in-part of Ser. No. 897,681, Apr. 19, 1978, abandoned.

[51] Int. Cl.³ .............................................. G02B 27/00
[52] U.S. Cl. ..................................... 250/551; 307/311
[58] Field of Search ......................... 250/551; 307/311

[56] References Cited

U.S. PATENT DOCUMENTS 3,691,403  9/1972  Newmeyer ....................... 307/311 X
4,079,272  3/1978  Howatt .............................. 307/311

OTHER PUBLICATIONS

Drawing for Allen–Bradley Part No. 634760 entitled, "*AC/DC Input Module Block Diagram*".

*Primary Examiner*—David C. Nelms
*Assistant Examiner*—Darwin R. Hostetter
*Attorney, Agent, or Firm*—Quarles & Brady

[57] ABSTRACT

An input circuit for a digital control system includes a rectifier circuit, a current limiting circuit and a set of zener diodes which can be selectively employed to receive a wide variety of signals from industrial sensing devices. The signal is generated to an output drive circuit by an optocoupler which provides electrical isolation. The output drive circuit generates a logic level signal which is compatible with the digital electronic control system. The input circuit is particularly well suited for fabrication as an integrated circuit.

18 Claims, 4 Drawing Figures

INPUT CIRCUIT FOR DIGITAL CONTROL SYSTEMS

RELATED APPLICATION

This application is a continuation-in-part of our earlier application Ser. No. 897,681 filed Apr. 19, 1978, now abandoned, and entitled "Input Circuit for Digital Control Systems."

BACKGROUND OF THE INVENTION

The field of the invention is input circuits to digital control systems such as programmable controllers, numerical control systems, and process controls, and particularly, to input circuits which convert the signals from various types of sensing devices into digital logic signals.

Digital control systems are commonly connected to sensing devices on industrial machines such as limit switches, pushbutton and selector switches, pressure switches and photoelectric switches. In a programmable controller system, for example, hundreds or even thousands of such sensing devices may connect to an I/O interface system which provides a separate input circuit for each device.

Each input circuit performs three primary functions. First, it converts the signal received from the sensing device to a logic level signal which is compatible with the digital control system. Second, it provides electrical isolation of the control system electronics from the surrounding environment, and third, it provides filtering which immunizes the control system from industrial noise and contact "bounce."

Because there are numerous types of sensing devices employed on industrial machines, a variety of input circuits must be offered by the controls manufacturer to interface his digital control system with the user's machine. For example, separate input circuits must be provided to interface with 220 volt a.c. signals, 120 volt a.c. signals, 42 to 53 volt d.c. signals or 10 to 26 volt d.c. signals. As a result, there is no known standard input circuit and it is common practice in the art to provide a set of input circuits built from discrete components for each particular digital control system offered by the manufacturer.

SUMMARY OF THE INVENTION

The present invention relates to an input circuit for a digital control system which will adapt to operate with nearly all sensing devices encountered in industrial applications and which is particularly suited for construction using integrated circuit techniques. The input circuit includes a rectifier circuit having a pair of output terminals which connect in series circuit with a current limiting circuit, a set of zener diodes and a light emitting diode of a photo coupler; and an output drive circuit which is driven by a light sensing element in the photo coupler and which converts the signal generated by the photo coupler to a logic level signal suitable for application to the data bus of a digital control system.

A general object of the invention is to provide an input circuit for digital control systems which will interface with a wide variety of sensing devices. The rectifier circuit enables the circuit to accommodate either a.c. or d.c. input signals and the zener diodes may be selectively employed to accommodate various input voltage levels. The current limiting circuit enables the input current level to be controlled regardless of the applied input voltage.

Another object of the invention is to provide electrical isolation between the input and output of the circuit. The photo coupler electrically isolates the output drive circuit from the remainder of the circuit and it thus isolates the digital circuitry to which the output drive circuit attaches from the surrounding environment.

Another object of the invention is to filter out electrical noise which may be induced in the lines that connect the input circuit to its associated sensing device. In addition to the filtering capability which is inherent in the zener diodes and the photo coupler, the output drive circuit includes an operational amplifier which connects to the photo coupler through an R-C filter. The time constant of the R-C filter is selected to accommodate the particular sensing device used and hence it filters out electrical noise and contact bounce having a faster rise time.

Yet another general object of the invention is to provide an input circuit which incorporates the advantages of integrated circuit technology. By providing an input circuit which is universally applicable regardless of the type of sensing device used, it becomes economically feasible to construct the input circuit using integrated circuit techniques. The elements of the input circuit are compatible with this technique.

The foregoing and other objects and advantages of the invention will appear from the following description. In the description reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

DESCRIPTION OF THE PREFERRED EMBODIMENT

Figure 1:
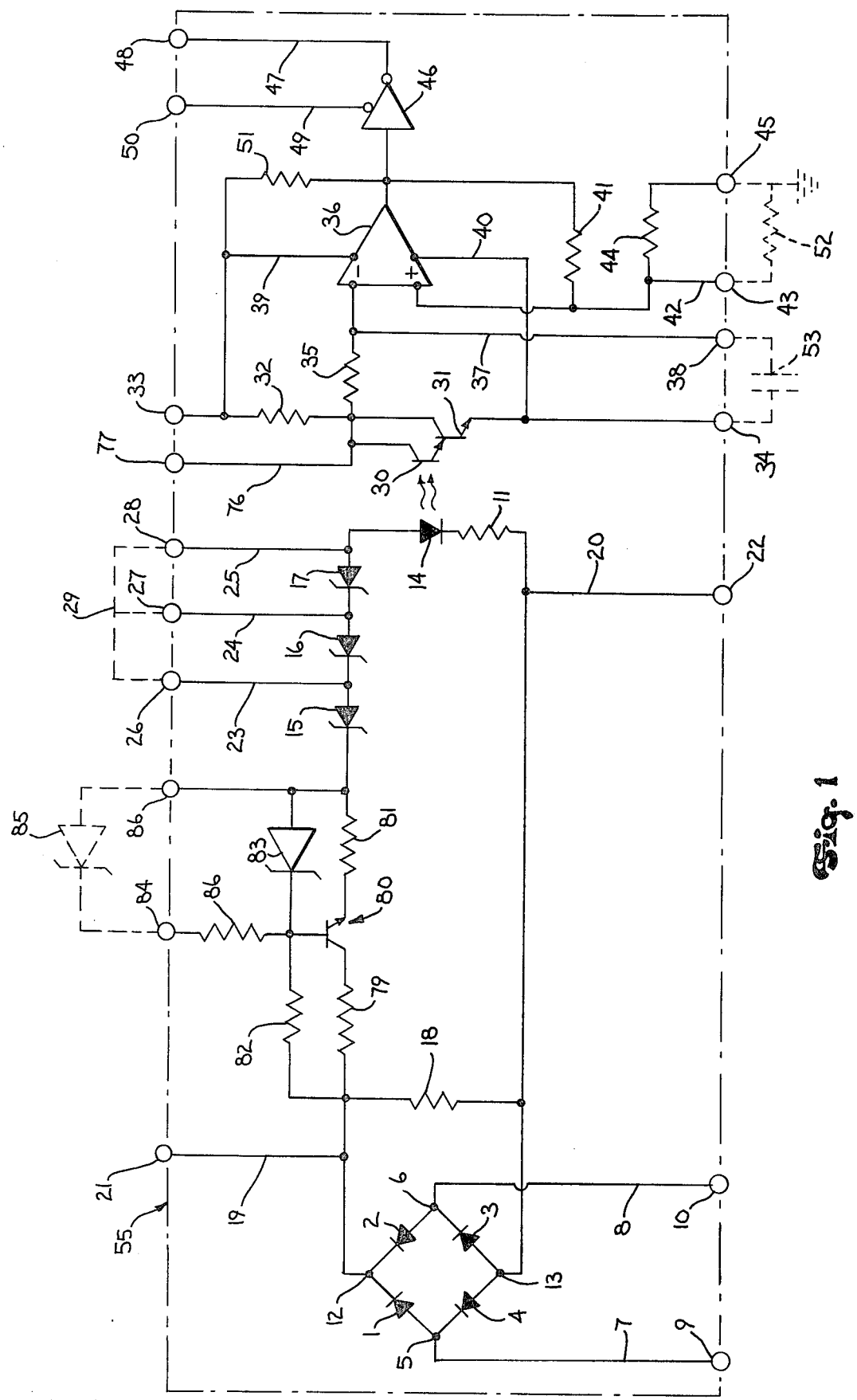
FIG. 1 is an electrical schematic diagram of the preferred embodiment of the invented input circuit.

Referring particularly to FIG. 1, the electrical elements of the input circuit are contained within a case which is indicated schematically by a dashed line 55. The input circuit includes a full wave bridge rectifier circuit comprised of a set of four diodes 1–4 and it includes a pair of rectifier input terminals 5 and 6 which are connected through leads 7 and 8 to a pair of a.c. input terminals 9 and 10 respectively. The a.c. input terminals 9 and 10 are outside the case 55 and are, therefore, accessible to the user. The rectifier circuit also includes a pair of output terminals 12 and 13, one of which connects to the cathode of a light emitting diode 14 through a resistor 11. The other output terminal 12 connects to a resistor 79 which connects to the collector of an NPN transistor 80. The emitter of transistor 80 in turn connects through a resistor 81 and through a set of three series connected zener diodes 15–17 to the anode of the light emitting diode 14. A shunt resistor 18 is connected across the rectifier output terminals 12 and 13, and the terminals 12 and 13 are also connected through leads 19 and 20 to a pair of external d.c. input terminals 21 and 22. The anodes of the respective zener diodes 15-17 also connect through leads 23-25 to external terminals 26-28.

The resistor 79, transistor 80 and resistor 81 form part of a current limiting circuit. The base of the transistor 80 connects through a first bias resistor 82 to the output terminal 12 and through a zener diode 83 to the juncture of resistor 81 and zener diode 15. The values of resistors 79, 81 and 82 and the breakdown voltage of zener diode 83 are selected such that a current of two milliamperes flows through the transistor 80 regardless of the voltage appearing across output terminals 12 and 13. This minimum current level is sufficient to operate the light emitting diode 14 without generating excessive heat.

The current limiting circuit can be adjusted at external terminal 84. The terminal 84 connects to the base of transistor 80 and an external zener diode 85 may be connected between this terminal and an external terminal 86 to increase base current to transistor 80. The input current to the light emitting diode 14 can thus be adjusted to a value of two milliamperes or more and this value will remain substantially constant for applied voltages ranging from 5 to 48 volts.

An a.c. input signal applied across the a.c. input terminals 9 and 10 is rectified by the diodes 1-4 and is applied to the zener diodes 15-17. When the rectified signal reaches the zener breakdown voltage, a current flows through them and through the light emitting diode 14 to indicate a logic high voltage state. The values of the respective zener diodes 15-17 are 3 volts, 7 volts and 20 volts and by selectively connecting shunting wires across the terminals 21 and 26-28 as indicated by dashed lines 29, the user may determine which, if any, zener diodes 15-17 are operative in the circuit. Voltage drops of 0, 3, 7, 10, 20, 23, 27 and 30 volts are thus possible and are selected to properly reduce the applied input voltage. It should be apparent that if a d.c. signal is coupled to the input circuit, the rectifier circuit is not needed and the input signal is applied across the d.c. input terminals 21 and 22. As before, the zener diodes 15-17 may be selectively shorted out to drop the level of the applied d.c. voltage.

Shunt resistor 18 serves to provide a maximum input impedance across the a.c. and d.c. input terminals. When the zener diodes 15-17 are nonconductive, they present a very high impedance to electrical noise which may appear across terminals 9 and 10 or terminals 21 or 22. The shunt resistor 18 provides a lower impedance current path for such noise to reduce its voltage level and to thus prevent the electrical noise from generating a current through the light emitting diode 14. It should be apparent that the user could add external resistors across the input terminals 9 and 10 or 21 and 22 to further reduce the input impedance of the circuit and that external resistors may also be connected in series with the applied a.c. or d.c. input signal to further reduce the applied voltage level. The input circuit of the present invention is thus adaptable to nearly all sensing devices which may be encountered in industrial applications.

The light emitting diode 14 forms part of an optical coupler which electrically isolates the above-described input circuitry from an output drive circuit. When current flows through the light emitting diode 14, it emits light across an insulating gap, and this light impinges on the base of an opto-transistor 30. The opto-transistor 30 is connected to a second transistor 31 in a Darlington configuration and their collectors are commonly connected through a load resistor 32 to a positive d.c. supply terminal 33 and commonly connected through a lead 74 to an external terminal 75. The emitter of second transistor 31 connects to a negative d.c. supply terminal 34 and its collector connects through a coupling resistor 35 to the inverting input of an operational amplifier 36. The coupling resistor 35 also connects through a lead 47 to a time delay terminal 38 which is accessible to the user.

The operational amplifier 36 is connected through leads 39 and 40 to the respective positive and negative supply terminals 33 and 34 and its output terminal is coupled through a feedback resistor 41 to its noninverting input. The noninverting input connects through a lead 42 to a first threshold terminal 43 and through a voltage divider resistor 44 to a second threshold terminal 45.

The output of the operational amplifier 36 connects to the input of a tri-state inverter gate 46. The output of the inverter gate 46 connects through a lead 47 to an output terminal 48 and its enable input connects through a lead 49 to an external enable terminal 50.

When there is no input signal to the circuit no light is emitted by the light emitting diode 14 and the transistors 30 and 31 are nonconductive. The noninverting input of the operational amplifier 36 thus rises to a high positive voltage and its output is driven low. This logic low output voltage is inverted to a logic high by the inverter gate 46 and is generated at the external output terminal 48 when a logic low enabling voltage is applied to the enable terminal 50.

When an input signal is applied to the circuit, the transistors 30 and 31 are driven to their conductive state by the light emitted from diode 14. The voltage at the inverting input of the operational amplifier 36 is thus pulled below the voltage at its noninverting input and the output of the operational amplifier 36 is driven sharply to a logic high voltage. This high voltage is inverted by the gate 46 and is generated at external output terminal 48 when a logic low enabling voltage is applied to the enable terminal 50.

The voltage divider network formed by resistors 41 and 44 establish the input voltage at which the operational amplifier switches logic state. When the transistors 30 and 31 are nonconductive the output of the operational amplifier is low and hence the voltage at its noninverting input is also relatively low. The transistors 30 and 31 must thus be driven quite hard in order to bring the inverting input voltage down to the switching point. Once this switching point is reached, however, the output of the operational amplifier goes high and the voltage at the noninverting input rises to change the switch point. This "hysteresis" insures that when the operational amplifier output is driven high by an input signal, it stays high for a time period which is sufficiently long to be recognized by the digital system connected to the circuit output terminal 48. The difference between the two switch points of the operational amplifier 36 can be altered by the user by adding an external resistor in series with resistor 44 at the threshold terminal 45 or by adding an external resistor in parallel with resistor 44 across the threshold terminals 43 and 45 as shown by the dashed lines 52.

When sensing devices such as switches are closed, their contacts often bounce and generate a series of voltage spikes of very short duration. To prevent the input circuit from interpreting such "contact bounce" as a series of changes in logic state, an R-C filter formed by resistor 35 and an external capacitor 53 is provided. The value of capacitor 53 is selected by the user to slow the response of the input circuit to a point where it is compatible with the particular sensing device used. Of course, in addition to filtering out voltage spikes caused by contact bounce, the R-C circuit also acts as a high frequency noise filter.

Figure 2:
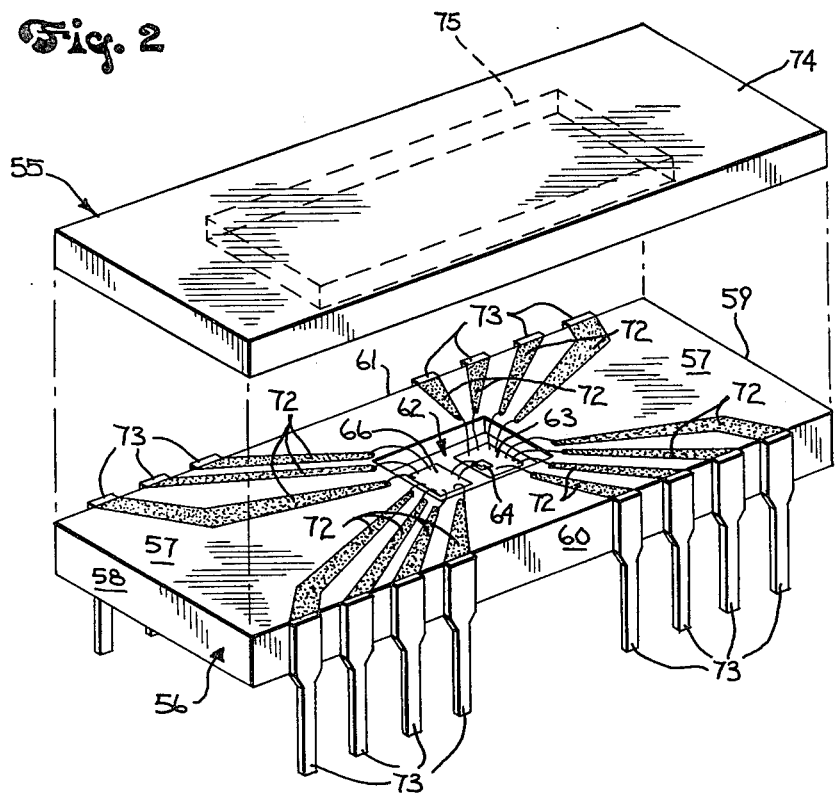
FIG. 2 is an exploded perspective view of a dual inline package which incorporates the input circuit of FIG. 1.

Referring particularly to FIG. 2, the input circuit of the present invention is preferably embodied in an integrated circuit which is housed in a dual in-line package, or case 55. The case 55 includes a ceramic base 56 having a rectangular shaped top surface 57 bounded by a pair of spaced end walls 58 and 59 and a pair of spaced side walls 60 and 61. A rectangular shaped depression, or recess 62 is formed at the center of this top surface 57 and it is in this recess that the electrical elements of the above-described input circuit are mounted.

Figure 3A:
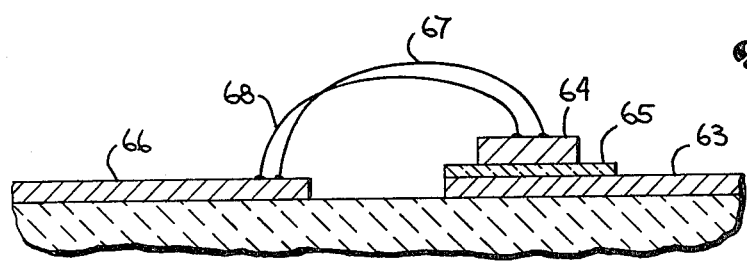
FIGS. 3A and 3B are partial views in cross section of two integrated circuit arrangements which form part of the package in FIG. 2.

Referring particularly to FIGS. 2 and 3A, the output drive circuit elements including the transistors 30 and 31 are fabricated on a first silicon substrate 63 using well known microelectronic techniques. The light emitting diode 14 is formed on a separate silicon substrate 64 and this is bonded to the first substrate 63 with a sheet of optically clear insulating material 65 sandwiched therebetween. The light emitting diode substrate 64 is positioned directly over the photo transistor 30 formed on the substrate 63 and it directs its generated light downward through the insulating material 65.

The remainder of the input circuit elements are formed on a third silicon substrate 66 which is bonded in place alongside, but spaced from the first substrate 63. A pair of fine wire leads 67 and 68 connect to bonding pads on the second and third substrates 64 and 66 to electrically connect the light emitting diode 14 to the circuit elements on the third substrate 66. The circuit elements on the third substrate 66 are thus electrically isolated from the output drive circuit elements on the first substrate 63. The degree of electrical isolation is determined primarily by the thickness and dielectric characteristics of the insulating material 65. In the preferred embodiment optical glass is employed, however, other high dielectric materials which are transparent to light are also suitable for this purpose.

Figure 3B:
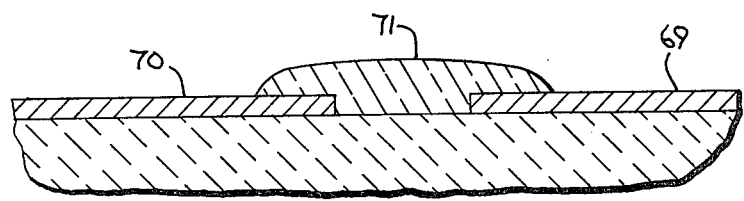

If greater electrical isolation is needed the structure shown in FIG. 3B can be substituted for that in FIG. 3A. In this embodiment the output drive circuit elements are fabricated on a first silicon substrate 69 along with the photo transistor 30. The remaining elements, including the light emitting diode 14, are formed on a second silicon substrate 70 which is bonded in place alongside the first substrate 69. The substrates are spaced apart to electrically isolate them from one another and the light emitting diode 14 on the second substrate 70 emits light upward into a mass of transparent epoxy 71 which overlaps both substrates 69 and 70. The transparent epoxy has a high index of refraction and a relatively high dielectric constant. As a result, it maintains electrical isolation between the two substrates 69 and 70 and it reflects the light from the diode 14 on the second substrate 70 to the photo transistor 30 on the first substrate 69 with minimal loss.

Other arrangements of the integrated circuit chips in the recess 62 are, of course, possible.

Referring particularly to FIG. 2, the external connections to the electrical elements on the integrated circuit chips mounted in the recess 62 are made through a set of conductive paths 72 formed on the top surface 57 of the ceramic base 56. The conductive paths 72 are formed by depositing a layer of gold on the ceramic base 56 in the desired pattern. Each conductive path leads from a point adjacent the recess 62 to a point along one of the side walls 60 or 61 where it is soldered to one of fourteen leads 73. Each conductive path 72 is electrically connected to a bonding pad on the first or second substrates 63 or 66 by a fine wire. The particular points of connection are indicated in FIG. 1 as the terminals 9, 10, 21, 22, 26, 27, 28, 33, 34, 38, 43, 45, 48, 50 and 75.

The size of the base 56 and the locations and spacing of the leads 73 are the same as a conventional twenty-pin dual in-line package. A ceramic cover 74 having a recess 75 on its underside is bonded in place to fully enclose and protect the circuit elements and their connections to the leads 73. To insure electrical isolation of the output drive circuit elements from the circuit input terminals, all leads 73 which connect to the first substrate 63 are located at one end of the dual in-line package and all leads 73 connected to the second substrate 66 are located at the other end of the package. A gap along each side wall 60 and 61 is thus formed by unused pin positions to provide an additional margin of isolation.

We claim:

1. An input circuit for a digital system, the combination comprising:

a rectifier circuit having a pair of a.c. input terminals and a pair of output terminals;

a series circuit connected across the rectifier circuit output terminals and including the following series connected elements:

(a) a current limiting circuit which limits the current flowing in the series circuit to a preselected maximum value, (b) a plurality of series connected zener diodes having terminals which enable the zener diodes to be selectively shorted out of the series circuit to alter the voltage drop thereacross, and (c) a light emitting element which forms part of a photo coupler and which generates an electrical signal in a light sensing portion of the photo coupler when current flows in the series circuit;

and an output drive circuit which connects to said light sensing element and which converts the signal generated thereby to a logic level signal at an output terminal which is suitable for application to the data bus of the digital system.

2. The input circuit as recited in claim 1 in which said output drive circuit includes a logic gate having one input coupled to the light sensing element, a second input connected to an enable terminal and an output which forms the output of said output drive circuit, wherein said logic gate decouples the signal generated by said light sensing element from said output terminal when said enable terminal is driven to a preselected logic state.

3. The input circuit as recited in claim 2 in which the logic gate is coupled to said light sensing element through a filter comprised of a resistor and capacitor.

4. The input circuit as recited in claim 1 in which said current limiting circuit includes a transistor connected in series circuit with said light emitting element and a resistor connected to provide base current to said transistor.

5. The input circuit as recited in claim 1 in which a shunt resistor is connected across said rectifier circuit output terminals.

6. An input circuit for a digital system, the combination comprising:
- a rectangular base having a pair of spaced side walls;
- first and second sets of electrically conductive leads mounted along the respective side walls of said base;
- a first substrate mounted on said base and having formed integrally thereon circuit elements which include:
  - (a) a light sensing element for generating an electrical signal when light impinges on it; and
  - (b) means connected to said light sensing element for converting the signal generated by said light sensing element to a logic level signal at a circuit output terminal;
- a second substrate mounted on said base and having formed integrally thereon circuit elements which include:
  - (a) a rectifier having a pair of a.c. input terminals and a pair of output terminals which connect to a series circuit; and
  - (b) a current limiting circuit including a transistor which is connected in said series circuit to said rectifier circuit output terminals;
  - (c) a plurality of series connected zener diodes connected in said series circuit to said rectifier circuit output terminals and having terminals formed at the interconnection of each zener diode;
- a light emitting element connected in said series circuit to said rectifier circuit output terminals, said light emitting element being responsive to current flow therethrough to generate light and being positioned to direct said generated light onto the light sensing element on said first substrate; and
- electrical conductors connecting each of said circuit output terminal, a.c. input terminals, rectifier output terminals and zener diode terminals with respective ones of said electrically conductive leads, whereby selected ones of said zener diodes can be shorted out of said series circuit to alter the voltage drop thereacross.

7. The input circuit as recited in claim 6 in which said light emitting element is integrally formed on said second substrate.

8. The input circuit as recited in claim 7 in which said second substrate is mounted adjacent said first substrate in a substantially common plane and a light conductive element formed from an electrically insulating material is disposed over said light emitting and light sensing elements to convey light therebetween.

9. The input circuit as recited in claim 7 in which a logic gate is integrally formed on said first substrate and is electrically connected between said light sensing element and said circuit output terminal, said logic gate having an enable terminal which connects to one of said electrically conductive leads through an electrical conductor and which is operable when a preselected logic signal is applied to said enable terminal to decouple said circuit output terminal from said light sensing element.

10. The input circuit as recited in claim 9 in which a resistor is integrally formed on said first substrate and is electrically connected between said light sensing element and said logic gate, said resistor having a terminal which connects to one of said electrically conductive leads through an electrical conductor.

11. The input circuit as recited in claim 10 in which a resistor is integrally formed on said second substrate and is electrically connected across said rectifier circuit output terminals.

12. The input circuit as recited in claim 6 in which said light emitting element is formed on a third substrate which is mounted over the light sensing element on said first substrate with a light conductive electrical insulating material therebetween.

13. The input circuit as recited in claim 12 in which a logic gate is integrally formed on said first substrate and is electrically connected between said light sensing element and said circuit output terminal, said logic gate having an enable terminal which connects to one of said electrically conductive leads through an electrical conductor and which is operable when a preselected logic signal is applied to said enable terminal to decouple said circuit output terminal from said light sensing element.

14. The input circuit as recited in claim 13 in which a filter resistor is integrally formed on said first substrate and is electrically connected between said light sensing element and said logic gate, said filter resistor having a terminal which connects to one of said electrically conductive leads through an electrical conductor.

15. The input circuit as recited in claim 14 in which a resistor is integrally formed on said second substrate and is electrically connected across said rectifier circuit output terminals.

16. The input circuit as recited in claim 14 in which said means for converting the signal generated by said light sensing element includes an operational amplifier which is electrically connected between said filter resistor and said logic gate, said operational amplifier including a d.c. supply terminal which connects to one of said electrically conductive leads through an electrical conductor.

17. The input circuit as recited in claim 16 in which the electrically conductive leads connected to said first substrate elements are spaced apart from the electrically conductive leads connected to said second substrate elements by gaps along each side wall of said base.

18. The input circuit as recited in claim 10 in which the electrically conductive leads connected to said first substrate elements are spaced apart from the electrically conductive leads connected to said second substrate elements by gaps along each side wall of said base.

* * * * *